United States Patent
Adenot et al.

(10) Patent No.: US 6,677,762 B1
(45) Date of Patent: Jan. 13, 2004

(54) METHOD FOR DETERMINING THE PERMEABILITY OF A MAGNETIC MATERIAL BY COAXIAL LINE PERTURBATION

(75) Inventors: Anne Lise Adenot, Tours (FR); Olivier Acher, St Avertin (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/937,852
(22) PCT Filed: Apr. 11, 2000
(86) PCT No.: PCT/FR00/00918
§ 371 (c)(1), (2), (4) Date: Sep. 28, 2001
(87) PCT Pub. No.: WO00/63716
PCT Pub. Date: Oct. 26, 2000

(30) Foreign Application Priority Data

Apr. 15, 1999 (FR) .............................. 99 04726

(51) Int. Cl.$^7$ .............................................. G01R 27/04
(52) U.S. Cl. ...................................... 324/637; 324/639
(58) Field of Search ...................... 73/862.331; 324/201, 324/209, 228, 642, 643, 646, 637, 639

(56) References Cited

U.S. PATENT DOCUMENTS

| | | | | |
|---|---|---|---|---|
| 5,233,306 A | * | 8/1993 | Misra | 324/601 |
| 5,541,522 A | * | 7/1996 | Rosen et al. | 324/642 |
| 5,691,645 A | * | 11/1997 | Acher et al. | 324/637 |

FOREIGN PATENT DOCUMENTS

FR  26996836  6/1994

OTHER PUBLICATIONS

Determination of Electromagnetic Properties of Materials Using Flanged Open–Ended Coaxial Probe, by Ching–Lieh et al., IEEE Transactions on Instrumentation and Measurement; vol. 44, No. 1, Feb. 1995.*

Henaux, J.C., et al., "Dimensional Correction of High Dielectric and Magnetic Constants Determined by S Parameters Measurements," vol. 26, No. 15, 3 pages, Jul. 19, 1990.

Acher, O., et al., "Demonstration of Anisotropic Composites with Tuneable Microwave Permeability Manufactured from Ferromagnetic Thin Films," vol. 44, No. 5, 11 pages, May 5, 1996.

Jacquart, P–M., et al., "Permeability Measurement on Composites Made of Oriented Metallic Wires From 0.1 to 18 GHZ," vol. 44, No. 11, 5 pages, Nov. 11, 1996.

Acher, O., et al., "Direct Measurement of Permeability Up to 3 GHZ of Co–Based Alloys Under Tensile Stress," vol. 73, No. 10, 3 pages, May 15, 1993.

* cited by examiner

*Primary Examiner*—N. Le
*Assistant Examiner*—Walter Benson
(74) *Attorney, Agent, or Firm*—Thelen Reid & Priest, LLP

(57) ABSTRACT

The process determines the permeability of the magnetic material by disturbance of a hyper frequency coaxial line. In the process, a sample of the material is formed and placed in a hyper frequency coaxial line. The reflection and/or transmission of a hyper frequency electromagnetic wave on and/or through this coaxial line is measured and the result of this measurement is used to deduce the magnetic permeability of the material. The fractional volume of magnetic material in the sample compared with the volume of the disturbed coaxial line is less than 1%.

16 Claims, 1 Drawing Sheet

METHOD FOR DETERMINING THE PERMEABILITY OF A MAGNETIC MATERIAL BY COAXIAL LINE PERTURBATION

"This application is a national phase of PCT/FR00/00918 which was filed on Apr. 11, 2000, and International Application No. 99/04726, which was filed on Apr. 15, 1999, and was not published in English."

TECHNICAL DOMAIN

The purpose of this invention is a process for the determination of the permeability of a magnetic material by disturbance of a coaxial line. Its applications include characterization of materials, and particularly ferromagnetic materials.

STATE OF PRIOR ART

A network analyzer can be used to measure the reflection and transmission of a hyper frequency electromagnetic wave on and through a sample placed in a wave-guide. If this wave guide is a coaxial line, for example according to the APC7 standard that can carry a frequency band of up to 18 GHz, the permittivity $\epsilon$ and the permeability $\mu$ of the sample can be deduced from this measurement using the Nicholson and Weir equations [1, 2]. These equations are only applicable to a solid homogenous isotropic sample, and therefore many materials are excluded.

If the sample to be characterized is a very good conductor, the wave reaching the sample is entirely reflected, the transmission coefficient is zero and the reflected signal contains no information other than the highly metallic nature of the sample. Furthermore, thin metallic layers and particularly thin ferromagnetic layers cannot be directly characterized using this method.

Variants have been developed using other types of guides, but they cannot be used to measure the permeability of thin ferromagnetic layers for the same reasons.

Furthermore, methods using rectangular guides or micro-ribbon lines have been developed for non-metallic anisotropic samples. These samples only partially fill the guide, since sample dimensions are unacceptable (between 350–500 MHz, the dimensions are 53.4 by 27.9 cm). But these methods lead to very complex numeric calculations [3] compared with the solution of the Nicholson and Weir equations. Furthermore, the frequency band of each guide is narrow so that the guide has to be changed several times, and therefore the sample dimensions have to be changed to cover a wide frequency band.

The turn disturbance method is a simple method for characterization of thin ferromagnetic layers. It may be considered as being a short circuited micro-ribbon line, or it can be modeled as a square turn in which the inductance is disturbed by the presence of a magnetic sample. This method suffers from two major limitations:

1°) the turn must be calibrated using the measurement of a known sample; however, there is no standard hyper frequency permeability, and no simple means of relation to a primary standard;

2°) Apart from the limitation of its frequency band, a demagnetizing field is introduced by the parallelepiped shape of the sample [4]; since the dimension of the sample is limited in the direction parallel to the hyper-frequency magnetic excitation, poles are created at the ends which modifies the permeability of the sample compared with a larger sample. This effect gets weaker as the ratio between the dimension parallel to the excitation and the thickness increases.

The size limitation of the turns is related to their high frequency nature, and therefore it is not possible to increase the dimensions without reducing the accessible frequency band.

In the case of materials in the form of wires, it is known that the magnetic properties of wires change very considerably below a certain length. Therefore, it is very penalizing to be obliged to restrict measurements to short samples, as is the case for measurement in turns.

Document FR-A-2 699 683 describes a process for determination of the intrinsic magnetic permeability of elongated ferromagnetic elements in which a wound torus is made with ferromagnetic elements, this torus is placed in a coaxial line, the properties of the torus are measured and the permeability of the ferromagnetic elements is deduced. This method has the advantage that it does not require a permeability standard. It also covers a wide frequency band (from 50 MHz to 18 GHz). Finally, the magnetic sample is long in the direction of the hyper frequency magnetic excitation and there is no risk of creating demagnetizing effects.

However, this method has disadvantages. Firstly, it needs much greater quantities of material than the measurement in turns: several tens of $mm^3$, compared with a tenth of a cubic millimeter or less for turn techniques. Methods of making thin layers and wires are rarely compatible with the production of a few tens of cubic millimeters of material. Even if is possible to acquire the right quantity of material, it is still difficult to be sure about the uniformity of the properties of the rest of the material used to make the sample.

Secondly, the fact of winding the flexible material starting from the inside diameter of the coaxial lime results in a very small radius of curvature of the material, of the order of 1.5 mm for an APC7 line. However, it is known that the risk of observing magnetostrictive effects that affect material properties increases as the stress increases. The fact that the curvature varies considerably between the inside diameter and the outside diameter of the line makes any attempt at correcting or taking account of this effect illusory.

Finally, the last disadvantage of the measurement of a wound torus is that preparation of the sample is long and difficult. Several meters of ferromagnetic ribbon or several hundreds of meters of wire has to be prepared. In practice, the need for precise dimensions for a sample makes machining operations essential and glue has to be used to hold the many ribbon turns, that introduces badly controlled stresses. Removal of magnetic material created during machining causes an inaccuracy about the content of magnetic material, which affects the permeability of the ferromagnetic constituent.

The purpose of this invention is to overcome these disadvantages.

PRESENTATION OF THE INVENTION

The invention makes use of the idea of a measurement in a coaxial line disturbed by the sample, as described in FR-A62 699 683, but with the fractional volume of the sample being much smaller. In this invention, this fraction (which is the ratio between the volume of the sample and the volume of the part of the coaxial line on which the sample is located) is less than 1%. This fraction is much greater in prior art (several tens of a percent). In the examples that will be described later, the fractional volume is as lower as 0.8% or even 0.06%. These very low values make it necessary to find a new solution to the problem of determining the permeability (the formulas given in the patent mentioned are no longer valid). Furthermore, precautions have to be taken to prevent or reduce the demagnetizing fields when making the sample.

More precisely, the purpose of the invention is a process for determination of the permeability of a magnetic material by disturbance of a hyper frequency coaxial line, in which a sample of the said material is formed, this sample is placed in a hyper frequency coaxial line, the reflection and/or transmission of a hyper frequency electromagnetic wave through this coaxial line is measured and the result of this measurement is used to deduce the magnetic permeability of the material, this process being characterized in that the fractional volume of the magnetic material in the sample is less than 1% of the volume of the disturbed coaxial line.

The sample can be created by winding a wire or a ribbon on a toric support, for example an insulating support, or a thin layer can be deposited on such a support. The ribbon can be obtained by depositing a thin layer of magnetic material on a flexible substrate and cutting a ribbon in this substrate along a determined direction. Therefore the permeability measurement will be related to this direction. The direction can be changed to explore the permeability in several directions.

One end of the wire or ribbon can be fixed on the toric support, tension can be applied to this wire or this ribbon, and then the second end of the wire or ribbon can be fixed on the support. The permeability under stress is thus measured, which is different from the stress free permeability due to magnetostrictive effects.

The sample can also be formed directly on conductors inside or outside the coaxial line.

The sample may be in the form of a complete torus or simply a toric sector.

The magnetic material for which the permeability is to be measured may be arbitrary, and in particular it may be ferromagnetic.

dr

DETAILED PRESENTATION OF PARTICULAR EMBODIMENTS

In a first embodiment, the coaxial line used is according to the APC7 standard. The insulating toric support has an inside diameter equal to the inside diameter of the central conductor of the line, which is A=2.94 mm; the outside diameter is 5.94 mm, and is therefore less than the outside diameter of the outside conductor (B=7.1 mm). The height H of the torus is 3 mm. The example magnetic material chosen is a composite glass/ferromagnetic wire (ferromagnetic composition=CoMnSiB) with diameter $2R_{wire}=150\,\mu m$. A length L=5.9 cm of wire is wound around the outside diameter P of the torus, namely 3 turns. The toric support is made of plexiglas. The fractional volume of material is then 0.8%.

The permeability $\mu_m$ of a uniform sample in a line length d is calculated either by a measurement in reflection transmission using Nicholson and Weir equations, or in front of a short circuit. It may be sufficient to measure the reflection of the wave on the sample in front of a short circuit. The impedance Z is calculated as a function of the reflection ratio S at frequency f using the following relation (where c is equal to the speed of light and j*j=−1):

$$Z = \sqrt{\frac{\mu_m}{\varepsilon}}\,\tan(j\frac{2\pi}{c}fd\sqrt{\varepsilon\mu})_m = j\frac{2\pi}{c}fd\mu_m = \left(\frac{1-S}{1+S}\right)$$

The permittivity ($\varepsilon$) (known for example by a reflection/transmission measurement) can also be introduced into this calculation to obtain a more precise calculation at high frequency.

The contribution of the toric Plexiglas support can be taken into account as follows. It is assumed that at the working wave length (for example this wave length is 10 cm at 3 GHz), the three turns of wires form a composite "ring" composed of air and wire, with thickness equal to the wire diameter and 3 mm high. It is shown magnetostatically that the equivalent permeability $\mu_{1+2}$ of an assembly formed by two coaxial cylinders around a wire through which a current passes, with permeabilities $\mu_1$ and $\mu_2$ respectively, with inside and outside diameters of R0 and R1, and R1 and R2 respectively, can be written:

$$\mu_{1+2}\text{Ln}\frac{R2}{R0} = \mu_1\text{Ln}\frac{R1}{R0} + \mu_2\text{Ln}\frac{R2}{R1}$$

This is a means of eliminating the contribution of the Plexiglas ($\mu_1=1$) and of determining the permeability specific to the ring $\mu_2=(\mu_{ring})$, by choosing $R_0=A/2$, $R_1=P/2$, $R_2=B/2$.

If the outside ring were homogenous, the calculation would be finished. A simple homogenization law can be used now to deduce the permeability $\mu_i$ of the magnetic element alone, with load factor q in this ring:

$$q = \frac{\text{volume of wire}}{\text{volume of ring}} = \frac{R_{wire}^2 L}{((P+2*R_{wire})^2 - P^2)H}$$

Figure 1:
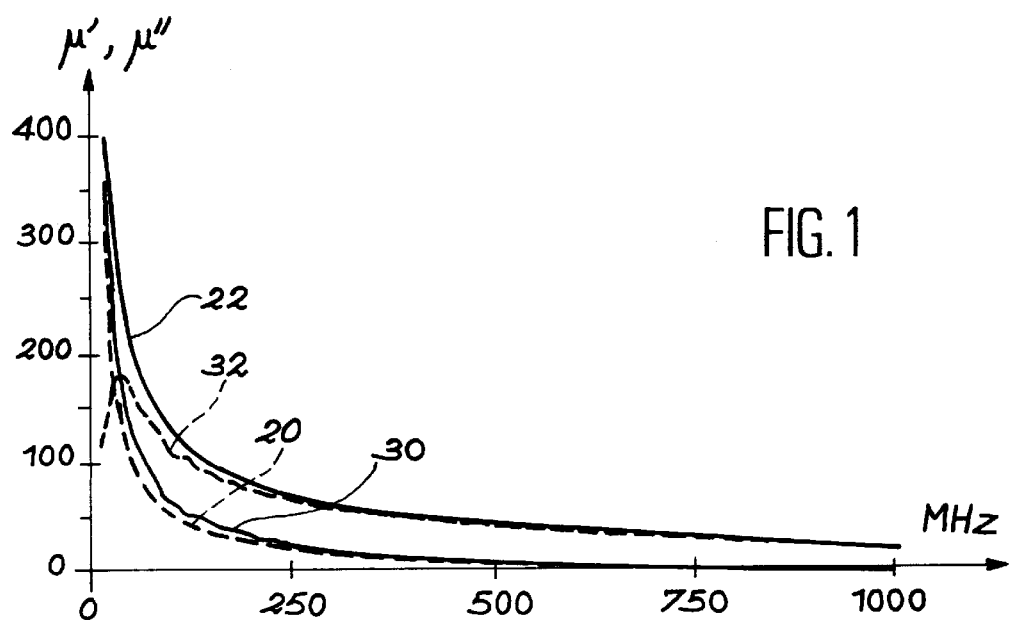
FIG. 1 shows the variations of the magnetic permeability of a wire as a function of the frequency, for measurements by turn disturbance and by coaxial line disturbance.

FIG. 1 shows the results obtained for the real part $\mu'$ (curve 20) and for the imaginary part $\mu''$ (curve 22) as a function of the frequency expressed in MHz. FIG. 1 also shows the results obtained using the turn disturbance method, for comparison (curves 30, 32).

In a second embodiment, the coaxial line used is according to the APC7 standard. The inside diameter A of the Plexiglas toric support is the same as the inside diameter of the inner conductor =2.94 mm; the outside diameter 2P is 5.94 mm, and is therefore less than B, the outside conductor diameter (7.1 mm). The height H of the torus is 3 mm. The magnetic material is a thin ferromagnetic layer with composition CoFeMoSiB and thickness $e_{ferro}$ 0.227 $\mu m$ on a 12.7 $\mu m$ thick flexible substrate (kapton). A 3 mm ribbon is measured over 90 mm, namely $n_{turns}=4.75$ turns. The fractional volume of the sample is 0.06%.

For thin layers sensitive to magnetostrictive effects, the direction of the winding on the ferromagnetic face on the inside or the outside creates opposite stresses that will vary the resonant frequency of the sample symmetrically about its value at the mechanical equilibrium of the film.

To compare the measurement methods, a wound torus with a load factor of 13% was built up with the same nature of ribbons and measured in an APC7 line. Measurements were also made by turn disturbance.

The measurement by coaxial line disturbance requires a deposition of 2.7 cm², which is easily possible using any deposition means, whereas a wound torus (prior technique) requires 600 cm² of deposit.

One possible calculation method consists of repeating the logarithmic formula once for each layer, considering the winding as a series of coaxial cylinders. But the procedure in the first example can also be used and two steps can be combined into one, using the approximation $P \gg n_{turns}(e_{ferro}+e_{substrate})$, to very easily find the permeability $\mu_{ferro}$ as a function of the measured permeability $\mu_{measured}$:

$$\mu_{ferro} - 1 = Ln\left(\frac{B}{A}\right)\frac{P}{e_{ferro}n_{turns}}(\mu_{measured} - 1)$$

Figure 2:
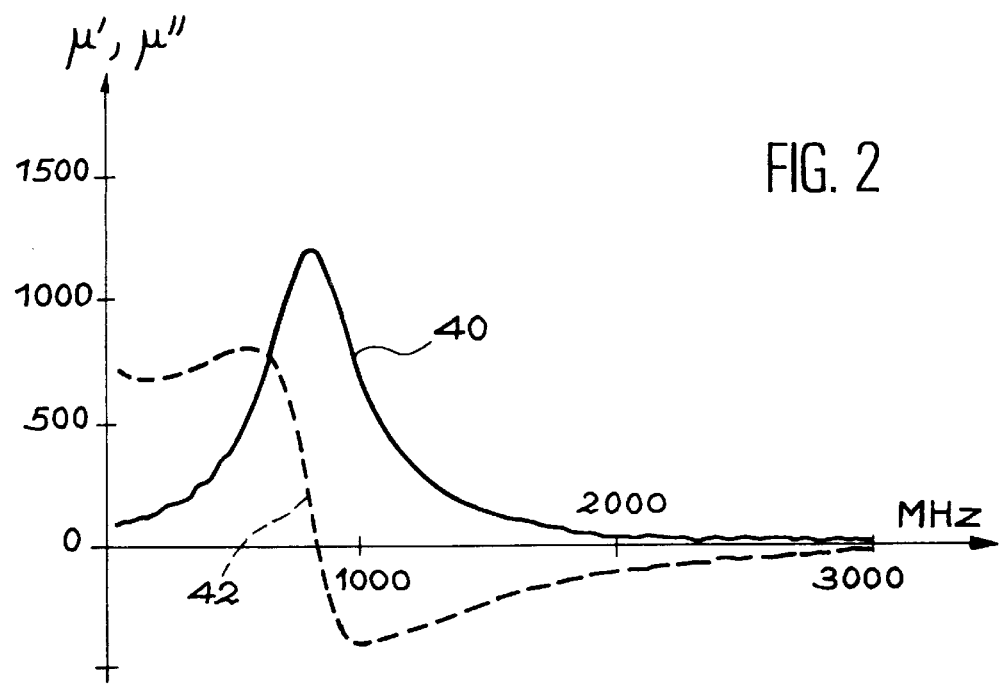
FIG. 2 shows variations of the magnetic permeability of a thin ferromagnetic layer as a function of the frequency for measurements by turn disturbance, by coaxial line disturbance and by wound torus.

FIG. 2 shows the results obtained. Curve 40 shows the real part $\mu'$ and curve 42 shows the imaginary part $\mu''$. The comparison with the turn method or the wound torus method shows very good agreement between the measurements (the corresponding curves are practically coincident with curves 40 and 42).

REFERENCES

1. "Measurement of the intrinsic properties of materials by time domain techniques", A. M. Nicholson and G. F. Ross, IEEE Trans. Instrum. Meas. 17 (1968), p.395.
2. "Automatic measurement of the complex dielectric constant and permeability at microwave frequencies", W. W. Weir, Proc. IEEE 62 (1974), p.33.
3. "Wide band measurement of the tensorial permeability of magnetized materials: inverse problem", P. Quéffélec and Ph. Gélin, Proceedings of the 5th Microwaves and Materials Characterization days, May 13–15 1998, document F7.
4. "Investigation of the gyromagnetic permeability of amorphous CoFeNiMoSiB manufactured by different techniques", O. Acher, C. Boscher, P. Le Guellec, Ph. Baclet and G. Perrin, IEEE Trans. Magn. 32 (1996), P. 4833.

What is claimed is:

1. Process for determination of the permeability of a magnetic material by disturbance of a hyper frequency coaxial line, in which a sample of the said material is formed, this sample is placed in a hyper frequency coaxial line, the reflection and/or transmission of a hyper frequency electromagnetic wave on and/or through this coaxial line is measured and the result of this measurement is used to deduce the magnetic permeability of the material, this process being characterized in that the fractional volume of magnetic material in the sample compared with the volume of the disturbed coaxial line is less than 1%.

2. Process according to claim 1, in which a wire containing the magnetic material on the surface of a toric support is wound to form the sample.

3. Process according to claim 2, in which a few turns of wire are wound on the toric support.

4. Process according to claim 2, in which the wire is a composite of the magnetic material and an insulating material.

5. Process according to claim 2, in which the toric support is insulating.

6. Process according to claim 2, in which a first end of the wire or ribbon is fixed on the surface of the toric support, tension is applied to the wire or the ribbon, and the second end of the wire or the ribbon is then fixed onto the surface of the toric support, the measured permeability then being a permeability under tension.

7. Process according to claim 1, in which a ribbon containing the magnetic material is deposited on the surface of a toric support, in order to form the sample.

8. Process according to claim 7, in which a thin layer of a magnetic material is deposited on a flexible substrate to obtain the ribbon, and a ribbon is cut out of this substrate along a determined direction.

9. Process according to claim 7, in which the toric support is insulating.

10. Process according to claim 7, in which a first end of the wire or ribbon is fixed on the surface of the toric support, tension is applied to the wire or the ribbon, and the second end of the wire or the ribbon is then fixed onto the surface of the toric support, the measured permeability then being a permeability under tension.

11. Process according to claim 1, in which the sample is created by depositing a thin layer containing the magnetic material on the outside surface of a toric support.

12. Process according to claim 11, in which the toric support is insulating.

13. Process according to claim 1, in which the sample is placed on the inside or outside conductor of the coaxial line.

14. Process according to claim 1, in which a sample is created in the form of a toric sector.

15. Process according to claim 14, in which the magnetic material is a ferromagnetic material.

16. Process according to claim 1, in which the magnetic material is a ferromagnetic material.

* * * * *